(12) United States Patent
Costello

(10) Patent No.: US 7,907,419 B2
(45) Date of Patent: Mar. 15, 2011

(54) GUIDE RECEPTACLE FOR TANDEM CIRCUIT BOARD MATING

(75) Inventor: Brian Patrick Costello, Scotts Valley, CA (US)

(73) Assignee: Tyco Electronics Corporation, Middletown, PA (US)

( * ) Notice: Subject to any disclaimer, the term of this patent is extended or adjusted under 35 U.S.C. 154(b) by 716 days.

(21) Appl. No.: 11/873,850

(22) Filed: Oct. 17, 2007

(65) Prior Publication Data

US 2009/0103273 A1    Apr. 23, 2009

(51) Int. Cl.
*H01R 12/06* (2006.01)

(52) U.S. Cl. ........ 361/786; 361/742; 361/758; 361/770; 361/804; 174/138 E; 174/138 G

(58) Field of Classification Search .................. 361/742, 361/756, 758, 770, 788, 786, 796, 802, 804; 174/138 E, 138 G See application file for complete search history.

(56) References Cited

U.S. PATENT DOCUMENTS

| 4,444,318 | A | * | 4/1984 | Alexander | 211/41.17 |
|---|---|---|---|---|---|
| 5,008,777 | A | * | 4/1991 | Burns | 361/804 |
| 5,018,982 | A |   | 5/1991 | Speraw et al. | |
| 5,414,593 | A | * | 5/1995 | Furlan | 361/784 |
| 5,825,633 | A | * | 10/1998 | Bujalski et al. | 361/804 |
| 5,903,439 | A | * | 5/1999 | Tamarkin | 361/742 |
| 6,205,700 | B1 |   | 3/2001 | Rigby et al. | |
| 6,404,650 | B1 | * | 6/2002 | Boniface et al. | 361/796 |
| 6,739,880 | B2 | * | 5/2004 | Toyota | 439/74 |
| 6,757,177 | B2 |   | 6/2004 | Harris et al. | |
| 6,863,562 | B1 | * | 3/2005 | Jensen et al. | 439/571 |
| 6,997,736 | B2 | * | 2/2006 | Costello et al. | 439/378 |
| 7,326,092 | B2 | * | 2/2008 | Fedder et al. | 439/681 |
| 7,521,636 | B1 | * | 4/2009 | Chuang | 174/138 G |

* cited by examiner

Primary Examiner — Dameon E Levi

(57) ABSTRACT

A guide module is provided for connecting a primary circuit board and a secondary circuit board to a common backplane circuit board. The primary and secondary boards are in a tiered arrangement with both the primary and secondary circuit boards having interface connections on the backplane circuit board. The guide module includes a body having a height between opposite top and bottom surfaces. The height of the body establishes a stack height between the primary and secondary boards. Locating elements are formed on the top and bottom surfaces to locate and align the primary and secondary boards with respect to one another.

17 Claims, 4 Drawing Sheets

GUIDE RECEPTACLE FOR TANDEM CIRCUIT BOARD MATING

BACKGROUND OF THE INVENTION

The invention relates generally to interconnecting circuit boards and, more particularly, to a guide receptacle for mating a stacked arrangement of circuit boards to a common backplane.

As more functionality is added to electrical circuits and as electrical components become more miniaturized, the demand for circuit board interfaces with multiple interface connections has increased. Additional challenges are produced by the increasing speeds and density of signals transmitted across circuit board interfaces. It may be desirable to address these issues without adding bulk or complexity to the systems.

One approach to addressing these issues is in the use of stacked or tiered daughter boards with connectors on both boards that are interfaced in a perpendicular relationship with a common backplane or mid plane board. Heretofore, tiered circuit boards were arranged using standoffs to mechanically link the daughter boards together. While standoffs join the circuit boards together, they are not closely coupled to the interface connectors. As a result, tolerance issues may cause misalignment of the interface connectors. The lack of precision in positioning the circuit boards with standoffs may cause mating problems with the connectors.

With the growing demand for interface connectors on multiple stacked boards that interface to a common backplane, problems with tolerances and precision in circuit board alignment remain.

BRIEF DESCRIPTION OF THE INVENTION

In one embodiment of the invention, a guide module is provided for connecting a primary circuit board and a secondary circuit board to a common backplane circuit board. The primary and secondary boards are in a tiered arrangement with both the primary and secondary circuit boards having interface connections on the backplane circuit board. The guide module includes a body having a height between opposite top and bottom surfaces. The height of the body establishes a slack height between the primary and secondary boards. Locating elements are formed on the top and bottom surfaces to locate and align the primary and secondary boards with respect to one another.

Optionally, the locating elements comprise posts that extend from the top and bottom surfaces. Each locating element includes a rib configured to center the locating elements in corresponding locating holes within the primary and secondary boards. The body includes a mating face between the top and bottom surfaces that is parallel to a common mating plane for the primary and secondary boards. The body includes a mating face and a rearward end opposite the mating face. The body includes mounting holes proximate the rearward end for attachment of the primary and secondary boards to the guide module. The top surface of the body defines a stacking plane for the secondary board.

In another embodiment, a tiered circuit board assembly is provided. The assembly includes a primary circuit board having an interface for electrically connecting the primary circuit board to a primary circuit board interface on a backplane circuit board. A secondary circuit board has an interface for electrically connecting the secondary circuit board to a secondary circuit board interface on the backplane circuit board. A guide module is attached to the primary and secondary circuit boards for mechanically connecting the primary and secondary circuit boards to one another in a tiered arrangement wherein the interfaces on the primary and secondary circuit boards lie in a common mating plane.

DETAILED DESCRIPTION OF THE INVENTION

Figure 1:
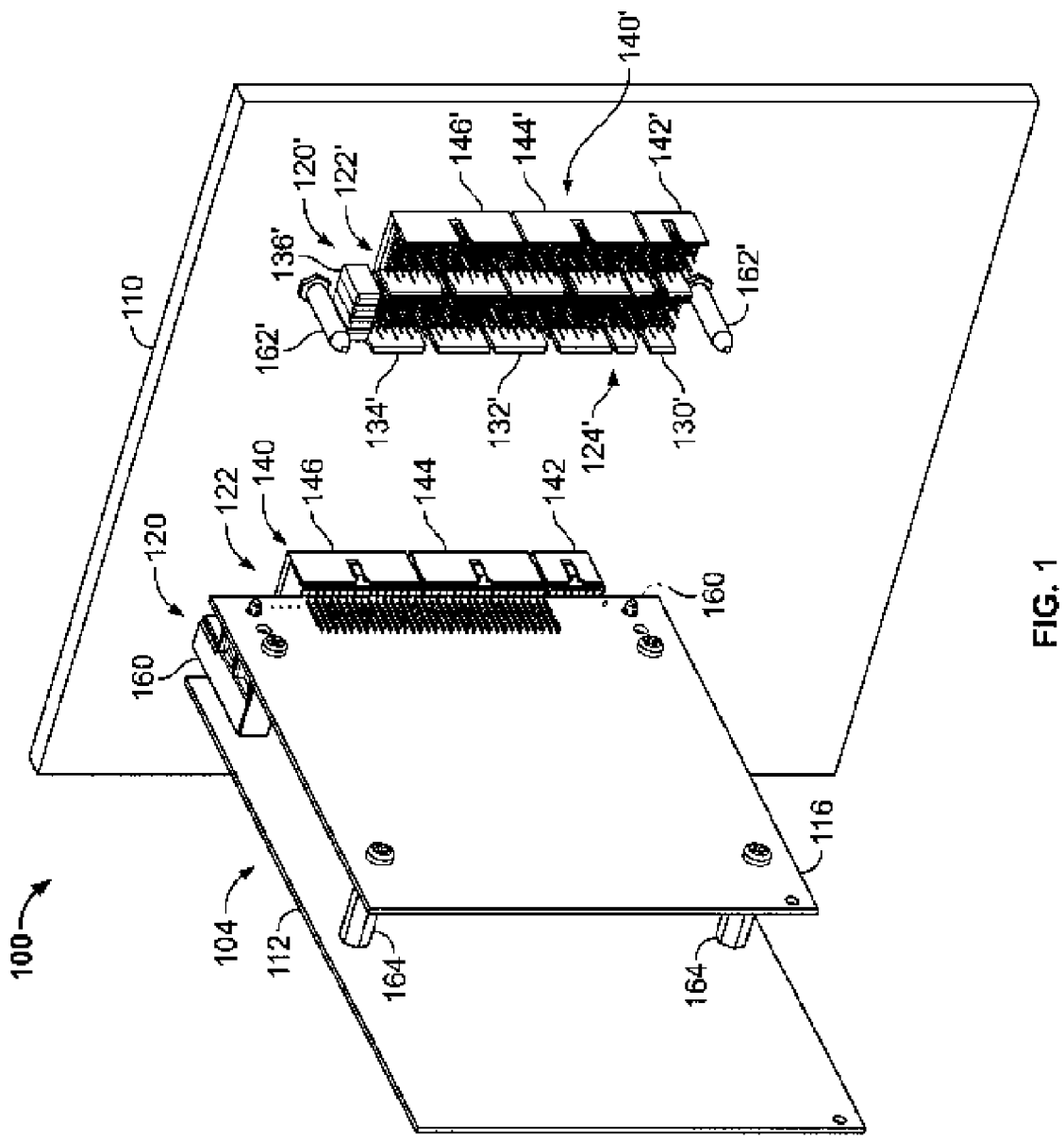
FIG. 1 is a perspective view of an electronic assembly including a daughter and mezzanine board assembly joined with a guide module formed in accordance with an embodiment of the present invention.

FIG. 1 illustrates an electronic assembly 100 including a tiered circuit board assembly 104 connected to a backplane circuit board 110. The tiered circuit board assembly 104 includes a daughter circuit board 112 and a mezzanine circuit board 116. Hereinafter the term "board" shall be synonymous with the term circuit board.

The backplane 110 may include an interface 120 having a plurality of connectors 122 arranged in groups of which the group 140 is visible in FIG. 1 and includes the connectors 142, 144, and 146. The group 140 defines an interface for the mezzanine board 116. The connectors 122 may include both signal and power connectors that are arranged and positioned to be mateable with corresponding connectors on the daughter board 112 and the mezzanine board 116. By way of example only, a second unmated interface 120' is shown which is identical to the interface 120. The interface 120' includes a plurality of connectors 122' arranged in a first group of connectors 124' configured to mate with a daughter board such as the daughter board 112 and including connectors 130', 132', 134', and 136'. A second group of connectors 140' is configured to mate with a mezzanine board such as the mezzanine board 116 and includes connectors 142', 144', and 146'. The connector groups 124' and 140' are representative of daughter board and mezzanine board interfaces on the backplane board 110. Generally, the interfaces 120 and 120' are electrical interfaces, however, in some embodiments, one or more of the interfaces 120 and 120' may be optical interfaces or any other interface type that requires that the mating components be in close alignment.

In addition, the daughter board 112 includes one or more guide receptacles or guide modules 160 formed in accordance with an exemplary embodiment of the present invention. The guide modules 160 are provided to position and align both the daughter board 112 and the mezzanine board 116 with the backplane board 110 as will be described. The guide modules 160 receive guide pins such as the guide pins 162' on the backplane board 110 to facilitate the establishment of perpendicularity between the daughter board and mezzanine board assembly 104 and the backplane board 110 as well as lateral positioning of the interface connections. Thus, in the assembly 104, two sets of interface connectors, one on the daughter board 112, and one on the mezzanine board 116, are sandwiched together simulating a single set of connectors interfaced to the backplane 110. While the invention will be described in terms of a guide module that receives a guide pin on the backplane, it is to be understood that no limitation is intended thereby. That is, the benefits of the invention may also be realized with a guide module including a guide pin that is received in a corresponding guide feature such as a socket, receptacle, or hole on/in the backplane board.

In the circuit board assembly 104, the guide modules 160 mechanically interconnect the daughter board 112 and the mezzanine board 116 and provide a common datum, as will be described, for all the connections from both the daughter board 112 and the mezzanine board 116 to the backplane board 110. As shown in FIG. 1, the guide module 160 is shared between the daughter board 112 and the mezzanine board 116. However, it is common to refer to one of the boards as the primary board while the other is referred to as the secondary board. In this discussion, the daughter board 112 may be referred to as the primary board and the mezzanine board 116 may be referred to as the secondary board. It is to be understood however, that this designation could be reversed. Additionally, it is to be understood that the number of guide modules 160 can be varied to meet the requirements of the particular application. However, at least two guide modules 160 are generally recommended to achieve proper spacing and alignment between the primary and the secondary boards, i.e. the daughter board 112 and the mezzanine board 116, respectively. In some embodiments, the assembly 104 may include traditional standoffs 164 remote from the interface 120 to provide support and stability to the assembly 104, particularly in assemblies that include larger circuit boards.

Figure 2:
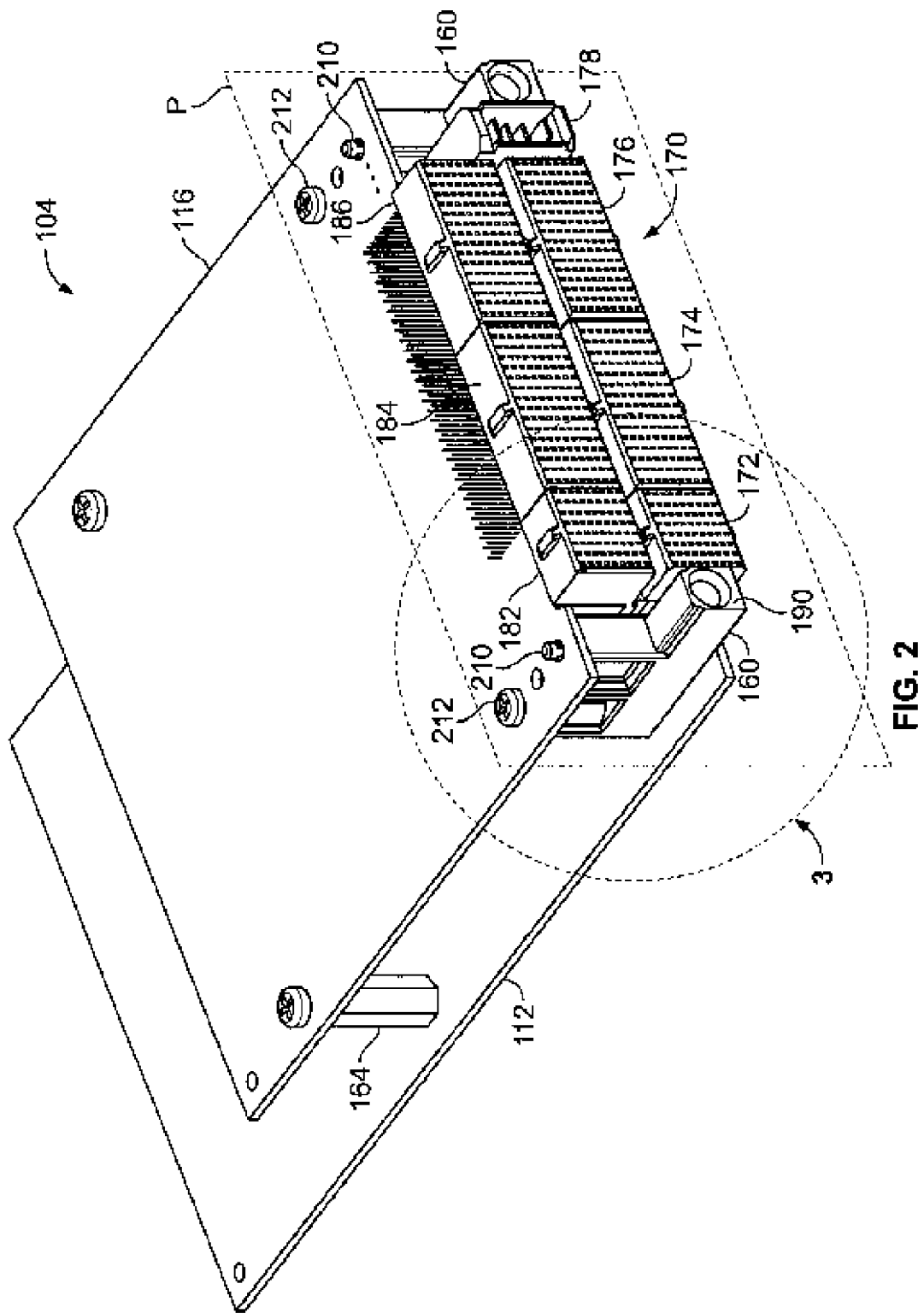
FIG. 2 is a perspective view of the daughter and mezzanine board assembly of FIG. 1 separated from the backplane board.
Figure 3:
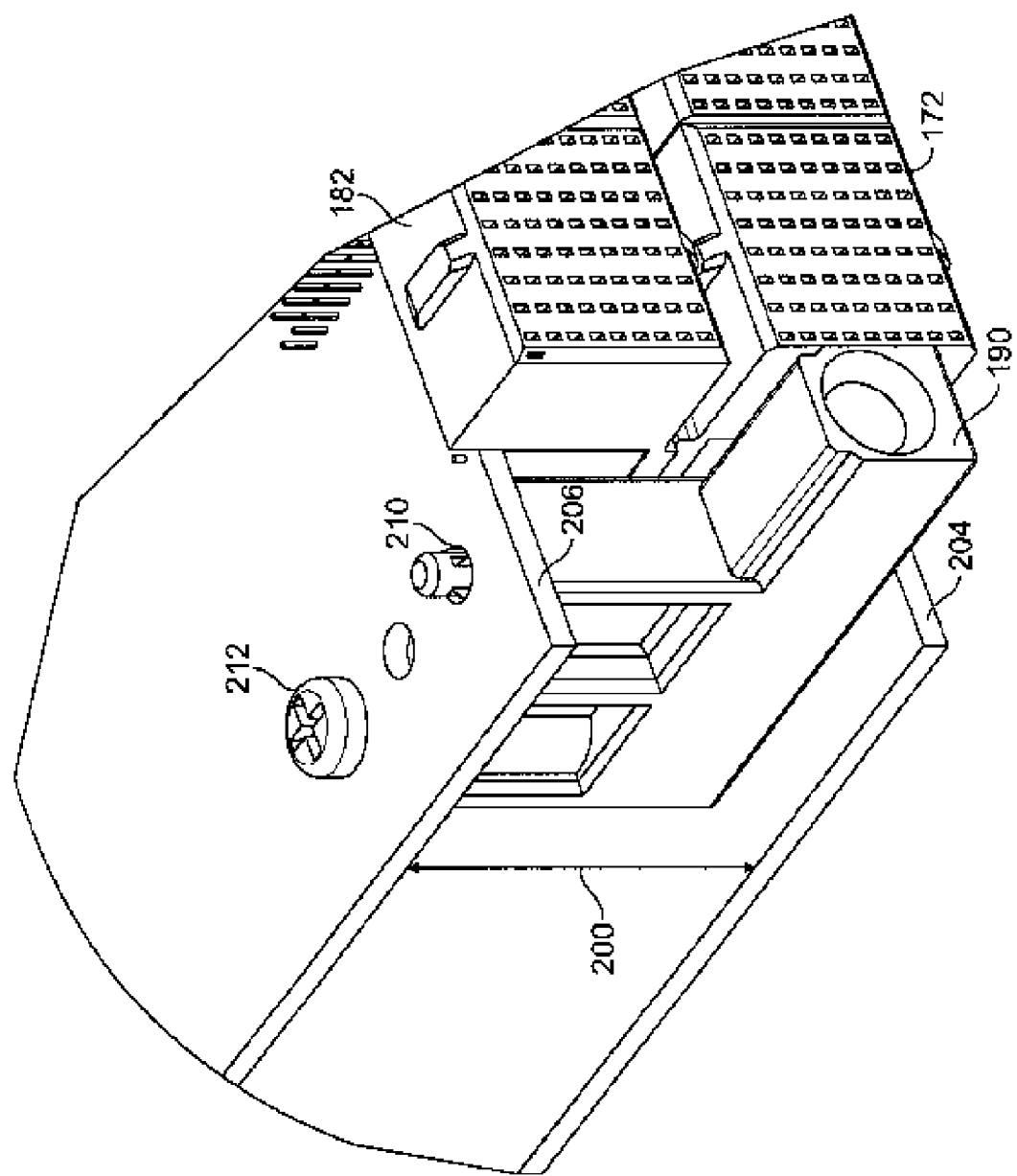
FIG. 3 is an enlarged fragmentary view of the daughter and mezzanine board assembly shown in FIG. 2.

FIG. 2 illustrates the circuit board assembly 104 separated from the backplane board 110. FIG. 3 illustrates an enlarged fragmentary view of a portion of the circuit board assembly 104. The assembly 104 includes a mating end 170 that encompasses the mating ends of connectors 172, 174, 176, and 178 on the daughter board 112 and connectors 182, 184, and 186 on the mezzanine board 116. More specifically, the guide modules 160 position and align the daughter board 112 and the mezzanine board 116 such that the mating ends of the connectors 172, 174, 176, 178, 182, 184, and 186 all lie in a common mating plane P. Notably, the standoffs 164 do not control spacing or alignment of daughter board 112 and the mezzanine board 116.

When the daughter board 112 is assembled to the mezzanine board 116 using the guide module 160, the resulting assembly 104 becomes a single unit for mating with the backplane 110. The guide module 160 includes a mating face 190 that is parallel to the mating plane P. The mating face 190 may or may not lie in the mating plane P. The guide module 160 establishes a stack height 200 between the daughter board 112 and the mezzanine board 116. The daughter board 112 and the mezzanine board 116 include front edges 204 and 206 respectively that in some embodiments are in a common plane. However, the front edges 204 and 206 may be offset from one another when the connectors 172, 174, 176, 178, 182, 184, and 186 on the daughter board 112 and the mezzanine board 116 have different mating dimensions. In an exemplary embodiment, the guide module 160 extends beyond the edges 204 and 206 of the daughter board 112 and the mezzanine board 116 so that when the assembly 104 is mated with the backplane board 110 (FIG. 1), the guide module 160 is the first component to mate. That is, the guide module 160 receives a corresponding guide pin on the backplane board 110 so that the assembly 104 is well aligned with respect to the backplane board 110 before any of the connectors 172, 174, 176, 178, 182, 184, and 186 are mated.

The mezzanine board 116 includes a locating hole 210 at each guide module location. A fastener 212 extends through an attachment hole (which is not visible) for mechanical attachment of the mezzanine board 116 to the guide module 160. Similar locating and attachment holes (which are also not visible) are provided in the daughter board 112 for mechanical attachment of the daughter board 112 to the guide modules 160.

Figure 4:
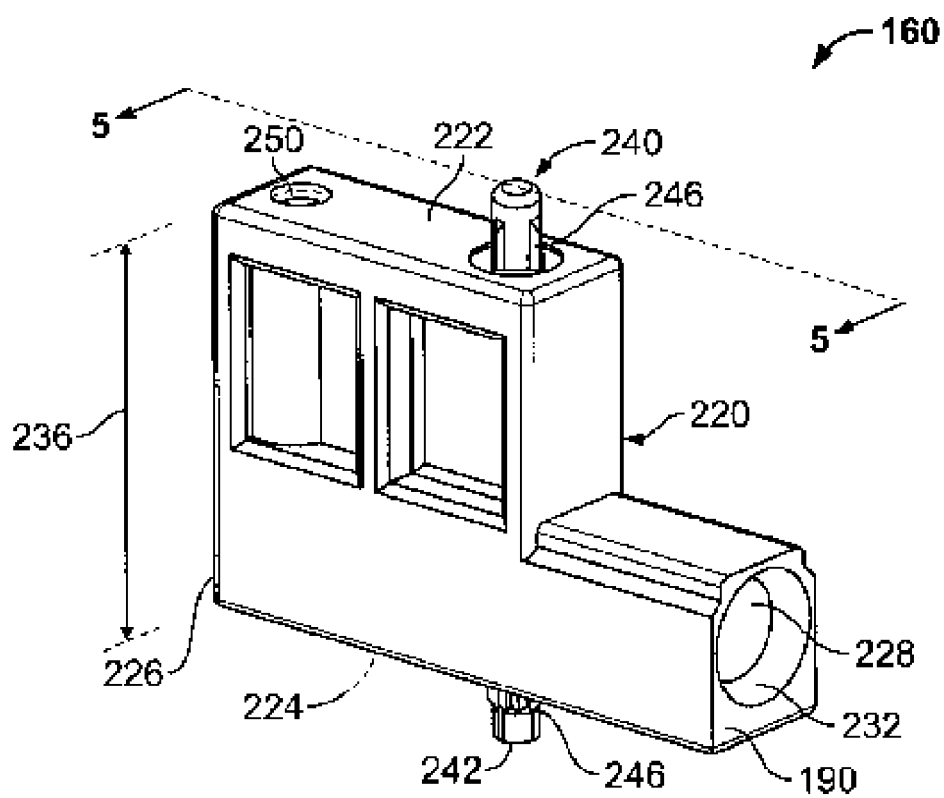
FIG. 4 is a perspective view of an exemplary guide module.
Figure 5:
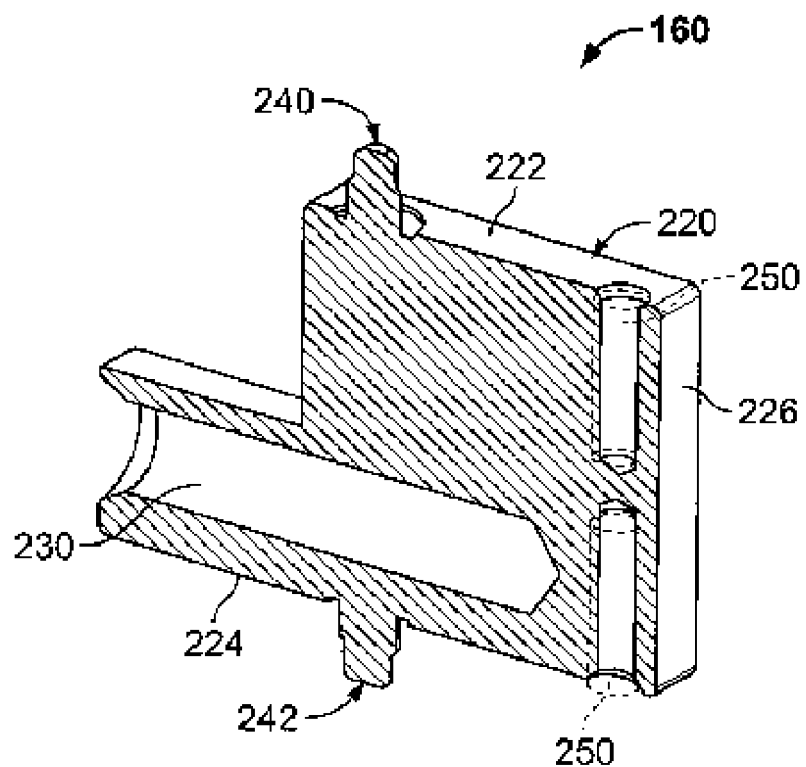
FIG. 5 is a cross-sectional view of the guide module taken along the line 5-5 in FIG. 4.

With continued reference to FIG. 2, FIG. 4 illustrates a perspective view of the guide module 160. FIG. 5 illustrates a cross-sectional view of the guide module 160. The guide module 160 includes a body 220 that has a top surface 222 and an opposite bottom surface 224. The top surface 222 and the bottom surface 224 are substantially parallel to one another and define stacking planes for the daughter board 112 and the mezzanine board 116. The mating face 190 of the guide module 160 is between the top and bottom surfaces 222 and 224 respectively. A rearward end 226 is opposite the mating face 190. The mating face 190 includes an aperture 228 that opens into a guide channel 230 sized to receive a guide pin such as the guide pin 162' (FIG. 1). The aperture 228 is provided with a beveled opening 232 that assists in centering the guide pin during mating of the assembly 104 with the backplane board 110 (FIG. 1). In the assembly 104, the mezzanine board 116 rests on the top surface 222 of the guide module 160 while the daughter board 112 engages the bottom surface 224 of the guide module 160. The body 220 of the guide module 160 has a height 236 between the top and bottom surfaces 222 and 224 respectively that establishes the stack height 200 (FIG. 3) between the daughter board 112 and the mezzanine board 116.

The guide module body 220 includes a locating element 240 formed on the top surface 222 and a second locating element 242 formed on the bottom surface 224. The locating element 240 is received in the locating hole 210 (FIG. 3) in the mezzanine board 116. The daughter board 112 includes a similar locating hole (not shown) that receives the locating element 242. A plurality of ribs 246 are formed on a perimeter of the locating elements 240 and 242. The ribs 246 facilitate centering of the locating element 240 in the locating hole 210 in the mezzanine board 116 and likewise with respect to the daughter board 112. In an exemplary embodiment, the locating elements 240 and 242 comprise posts that extend perpendicularly from their respective top and bottom surfaces 222 and 224. In alternative embodiments, the locating element may comprise a threaded hole that receives a fastener with a countersink. In such embodiments, the locating hole 210 in the mezzanine board 116 may be a countersunk hole sized to receive the countersunk fastener. Such embodiments facilitate the separation and reassembly of the daughter board 112 and mezzanine board 116.

The body 220 also includes mounting holes 250 proximate the rearward end 226 of the guide module body 220. The mounting holes 250 are configured to receive fasteners such as the fastener 212 to mechanically attach the daughter board 112 and the mezzanine board 116 to the guide module 160. In one embodiment, the mounting holes 250 are threaded holes. The locating elements 240 and 242 cooperate with the mounting holes 250 and fasteners 212 to provide an assembly 104 wherein tolerance errors are minimized. Sufficient precision is provided in the alignment of the daughter board 112 and mezzanine board 116 such that mating errors between the connectors on the assembly and the connectors on the backplane 110 are also minimized.

The embodiments thus described provide a guide module 160 that is suitable for mating tiered circuit board assemblies 104 to a common backplane 110. The guide modules 160 may minimize tolerance problems in the assembly 104 and may facilitate providing the precision required to maintain signal quality in high speed, high density circuit board assembly-to-backplane interface connections.

Exemplary embodiments are described and/or illustrated herein in detail. The embodiments are not limited to the specific embodiments described herein, but rather, components and/or steps of each embodiment may be utilized independently and separately from other components and/or steps described herein. Each component, and/or each step of one embodiment, can also be used in combination with other components and/or steps of other embodiments. When introducing elements/components/etc. described and/or illustrated herein, the articles "a", "an", "the", "said", and "at least one" are intended to mean that there are one or more of the element(s)/component(s)/etc. The terms "comprising", "including" and "having" are intended to be inclusive and mean that there may be additional element(s)/component(s)/etc. other than the listed element(s)/component(s)/etc. Moreover, the terms "first," "second," and "third," etc. in the claims are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

While the invention has been described in terms of various specific embodiments, those skilled in the art will recognize that the invention can be practiced with modification within the spirit and scope of the claims.

What is claimed is:

1. A guide module for connecting a primary circuit board and a secondary circuit board to a common backplane circuit board, the primary and secondary boards being in a tiered arrangement with both the primary and secondary circuit boards having interface connections on the backplane circuit board, said module comprising:
   a body having a height between opposite top and bottom surfaces, the height of said body establishing a stack height between the primary and secondary boards;
   locating elements formed on said top and bottom surfaces to locate and align the primary and secondary boards with respect to one another; and
   mounting holes formed on said top and bottom surfaces for attachment of the primary and secondary boards to the guide module wherein the mounting holes cooperate with the locating elements to reduce tolerance errors in mounting the primary and secondary boards.

2. The guide module of claim 1, wherein said locating elements comprise posts that extend from said top and bottom surfaces.

3. The guide module of claim 1, wherein each said locating element includes a rib configured to center said locating elements in corresponding locating holes within the primary and secondary boards.

4. The guide module of claim 1, wherein said locating elements comprise threaded holes configured to receive countersunk fasteners.

5. The guide module of claim 1, wherein said body includes a mating face between said top and bottom surfaces that is parallel to a common mating plane for the primary and secondary boards.

6. The guide module of claim 1, wherein said mounting holes are configured to receive fasteners to secure the primary and secondary boards to the guide module.

7. The guide module of claim 1, wherein said body includes a channel configured to receive a guide pin on the backplane board.

8. The guide module of claim 1, wherein said top surface of said body defines a stacking plane for the secondary board.

9. A tiered circuit board assembly comprising:
   a primary circuit board having an interface for electrically connecting said primary circuit board to a primary circuit board interface on a backplane circuit board;
   a secondary circuit board having an interface for electrically connecting said secondary circuit board to a secondary circuit board interface on the backplane circuit board; and
   a guide module attached to said primary and secondary circuit boards for mechanically connecting said primary and secondary circuit boards to one another in a tiered arrangement wherein said interfaces on said primary and secondary circuit boards lie in a common mating plane, the guide module including:
      locating elements formed on a top and bottom surface thereof to locate and align the primary and secondary boards with resect to one another, and
      mounting holes formed on said top and bottom surfaces for attachment of the primary and secondary boards to the guide module, wherein the mounting holes cooperate with the locating elements to reduce tolerance errors in mounting the primary and secondary boards.

10. The assembly of claim 9, wherein said guide module comprises a body having a height between said top and bottom surfaces, the height of said body establishing a stack height between the primary and secondary circuit boards.

11. The assembly of claim 9, wherein said locating elements comprise posts that extend from said top and bottom surfaces.

12. The assembly of claim 9, wherein said locating elements include a plurality of ribs configured to center said locating elements in locating holes in the primary and secondary circuit boards.

13. The guide module of claim 9, wherein said locating elements comprise threaded holes configured to receive countersunk fasteners.

14. The assembly of claim 9, wherein said body includes a mating face between said top and bottom surfaces that is parallel to the common mating plane for the primary and secondary circuit boards.

15. The assembly of claim 9, wherein said mounting holes are configured to receive fasteners to secure the primary and secondary circuit boards to said guide module.

16. The assembly of claim 9, wherein said guide module includes a channel configured to receive a guide pin on the backplane board.

17. The assembly of claim 9, wherein said top surface defines a stacking plane for said secondary circuit board.

* * * * *